US007821352B1

(12) United States Patent
Sanvoravong et al.

(10) Patent No.: US 7,821,352 B1
(45) Date of Patent: Oct. 26, 2010

(54) ULTRA-WIDEBAND, DIRECTIONAL COUPLER AND METHOD OF IMPLEMENTATION

(75) Inventors: Khamsouk Sanvoravong, Jupiter, FL (US); Robert Torsiello, Stuart, FL (US)

(73) Assignee: Smiths Interconnect Microwave Components, Inc., Stuart, FL (US)

( * ) Notice: Subject to any disclaimer, the term of this patent is extended or adjusted under 35 U.S.C. 154(b) by 10 days.

(21) Appl. No.: 12/143,467

(22) Filed: Jun. 20, 2008

Related U.S. Application Data

(60) Provisional application No. 60/936,877, filed on Jun. 22, 2007.

(51) Int. Cl.
*H01P 5/18* (2006.01)
*H03H 7/00* (2006.01)

(52) U.S. Cl. ...................................... 333/116; 333/172

(58) Field of Classification Search ................. 333/109, 333/112, 116, 172
See application file for complete search history.

(56) References Cited

U.S. PATENT DOCUMENTS 4,999,593 A * 3/1991 Anderson .................... 333/112
5,666,090 A * 9/1997 Tsuruoka .................... 333/116
7,218,186 B2 * 5/2007 Chen .......................... 333/116

* cited by examiner

*Primary Examiner*—Dean O Takaoka
(74) *Attorney, Agent, or Firm*—Ward & Olivo LLP

(57) ABSTRACT

The present invention is a wideband directional coupler comprising first and second coupled transmission lines and first and second equalizers connected at opposite ends of the coupled portion of the second transmission line. Illustratively, the first and second equalizers are RC filters. The first and second equalizers are designed to have transmission characteristics that vary with frequency so as to offset the frequency variation of the coupling factor of the coupled transmission lines.

7 Claims, 6 Drawing Sheets

ULTRA-WIDEBAND, DIRECTIONAL COUPLER AND METHOD OF IMPLEMENTATION

CROSS-REFERENCE TO RELATED APPLICATION

This application claims the benefit and priority of U.S. Provisional Application Ser. No. 60/936,877, filed Jun. 22, 2007, the entire contents of which are incorporated herein by reference.

FIELD OF THE INVENTION

The present invention relates to a wideband directional coupler that has a relatively flat response over a wide bandwidth.

BACKGROUND OF THE INVENTION

Directional couplers are passive devices used to couple part of the transmission power in one transmission line to a second transmission line. This is accomplished by locating a portion of the second transmission line close enough to the first transmission line that the electromagnetic signal passing through the first transmission line is electromagnetically coupled to the second transmission line. As shown in the schematic representation of FIG. 1, a typical directional coupler comprises first and second transmission lines 10, 20 that are electromagnetically coupled in a coupling region 25 and four ports 30, 40, 50, 60, one on each end of the coupling region of the transmission lines. By convention, the input and output ports of the signal transmission line (line 10 in FIG. 1) are referred to as the input and direct (or transmitted) ports and these are labeled ports 30 and 40, respectively, in FIG. 1. The ports of the coupled transmission line (line 20 in FIG. 1 are referred to as the coupled and isolated ports and these are labeled ports 50 and 60, respectively, in FIG. 1.

The coupling between the first signal transmission line 10 and the coupled transmission line 20 is ordinarily measured by a coupling factor in units of deciBels (dB). The coupling factor is defined as:

$$\text{coupling factor (dB)}=10 \log Pout/Pin$$

where Pin is the input power at port 30 and Pout is the output power at port 50. For example, if half the power is coupled from the first transmission line 10 to the second transmission line 20, the coupling factor is −3 dB.

Ideally, electromagnetic coupling between the two transmission lines occurs over a distance that is a quarter wavelength (λ/4) of the signal being transmitted on the transmission line. However, over a considerable part of the operating frequency range (20 MHz to 40 GHz) of electromagnetic signals on transmission lines, the wavelength of the signal is too large to permit the practical use of a directional coupler that is λ/4 long. For example, at 1 GHz, the wavelength is approximately 1 foot in length and at 100 MHz it is 10 feet in length. In such circumstances, the coupling distance in practical devices is typically a fraction of the ideal λ/4.

Unfortunately, the coupling factor is a function of frequency and the variation with frequency is exacerbated by the departure from ideal conditions. A typical plot of signal coupling in dB versus frequency is set forth in FIG. 2. As can be seen, the coupling factor ranges from about −24 dB at 100 MHz to about −12.5 dB at 500 MHz.

For many applications, this amount of variation in the coupling factor is undesirable and, as a practical matter, the only alternative is to limit the bandwidth of the coupler to a narrow enough range that the variation in coupling factor is acceptable. As a practical matter, this requires that conventional couplers have a bandwidth that is no more than about 50% of their center frequency.

SUMMARY OF THE INVENTION

The present invention is a wideband directional coupler comprising first and second coupled transmission lines and first and second equalizers connected at opposite ends of the coupled portion of the second transmission line. Illustratively, the first and second equalizers are RC filters. The first and second equalizers are designed to have transmission characteristics that vary with frequency so as to offset the frequency variation of the coupling factor of the coupled transmission lines.

BRIEF DESCRIPTION OF THE DRAWINGS

These and other objects and advantages of the present invention will be apparent to those of ordinary skill in the art in view of the following detailed description in which.

DETAILED DESCRIPTION

Figure 1:
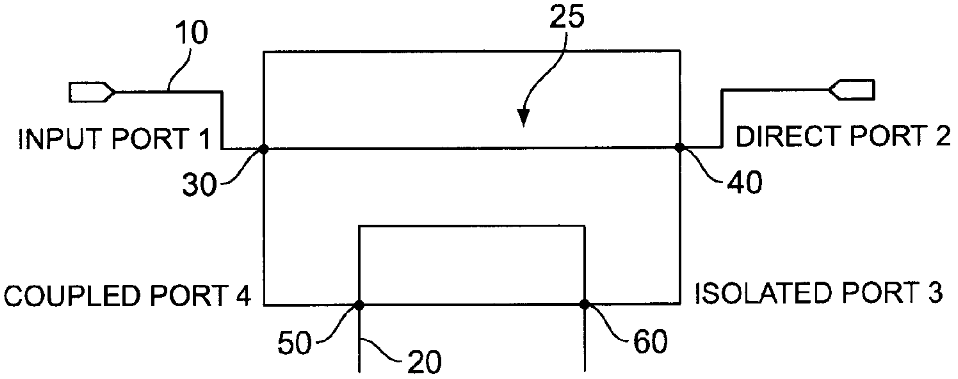
FIG. 1 (Prior Art)
FIG. 1 is a schematic illustration of a prior art directional coupler.
Figure 2:
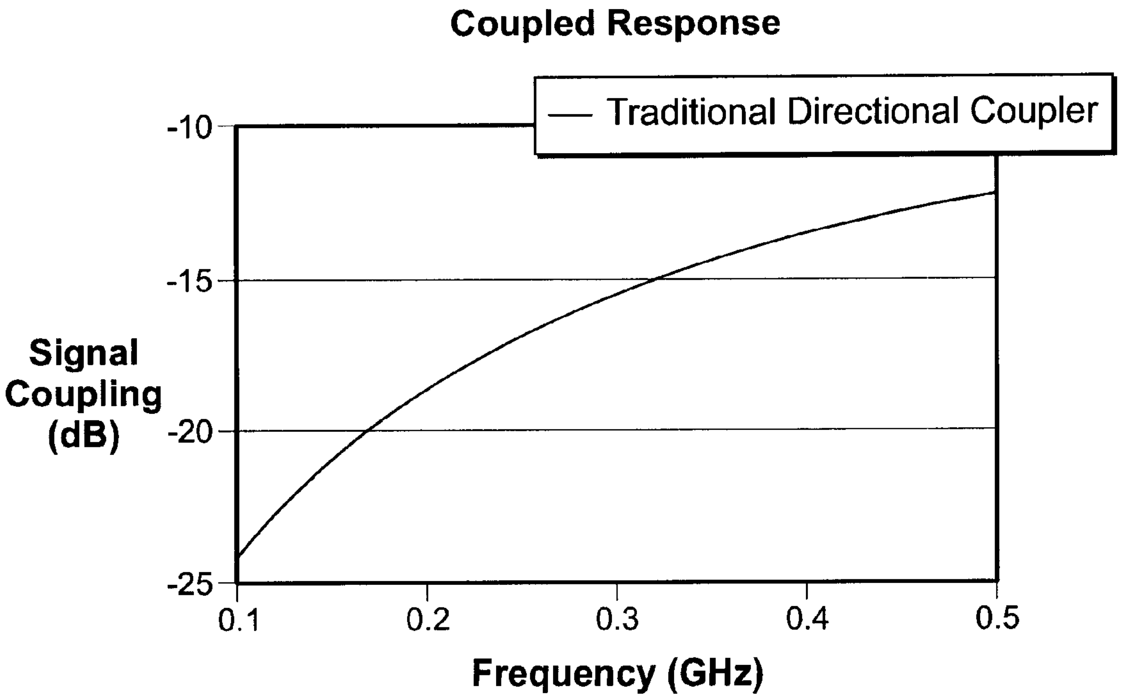
FIG. 2 is a plot of signal coupling versus frequency in a typical prior art directional coupler.
Figure 3:
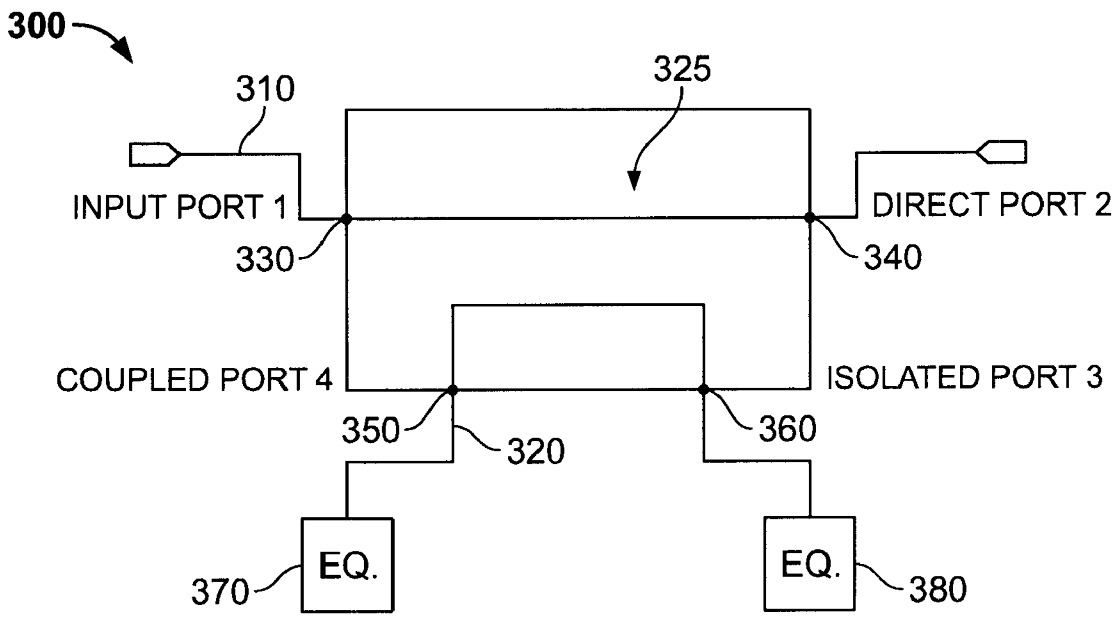
FIG. 3 is a block diagram of an illustrative embodiment of the invention.

FIG. 3 is a block diagram of an illustrative embodiment of a directional coupler 300 of the present invention. Coupler 300 comprises first and second signal transmission lines 310, 320 that are electromagnetically coupled in a coupling region 325 and first and second equalizers 370, 380 connected to the second transmission line on opposite sides of coupling region 325. Coupler 300 further comprises an input port 330 and a direct (or transmitted port) 340 connected to first transmission line 310 on opposite sides of coupling region 325 and a coupled port 350 and an isolated port 360 connected to second transmission line 320 on opposite sides of the coupling region 325. First equalizer 370 has a compensated coupled port 375, and second equalizer has a compensated isolated port 385. Coupler 300 is symmetric such that the locations of the input and direct ports on the first transmission line could be exchanged with a similar exchange of the locations of the coupled and isolated ports on the second transmission line.

In accordance with the invention, the frequency variation of the equalizers is designed to offset the frequency variation of the coupling factor of the coupled transmission lines as will be described in more detail below.

Figure 4:
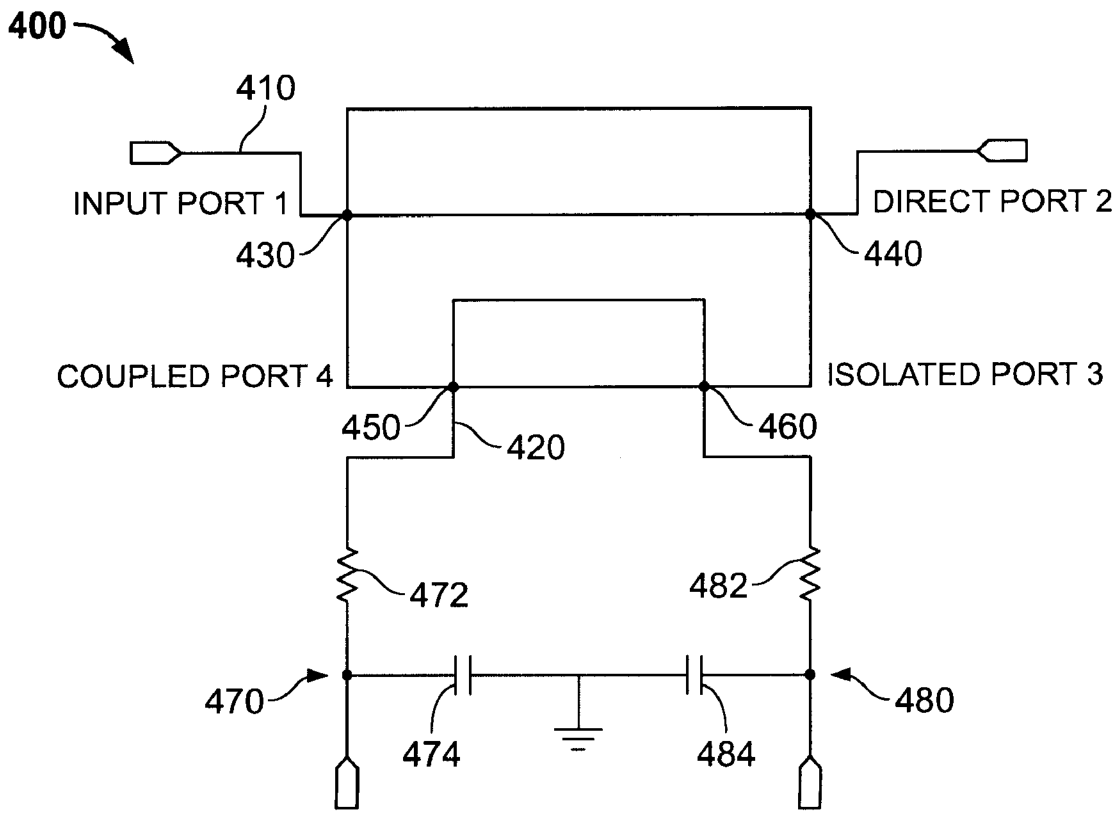
FIG. 4 is a schematic illustration of the embodiment of FIG. 3.

FIG. 4 is a schematic diagram of a directional coupler 400 of the present invention in which elements that correspond to elements of FIG. 3 bear the same number incremented by 100. Coupler 400 comprises first and second electromagnetically coupled signal transmission lines 410, 420 that are electromagnetically coupled in a coupling region 425 and first and second equalizers 470, 480 connected to the second transmission line on opposite sides of coupling region 425. Coupler 400 further comprises an input port 430 and a direct (or transmitted port) 440, connected to first transmission line 410 on opposite sides of coupling region 425, a coupled port 450 and an isolated port 460 connected to second transmission line 420 on opposite sides of coupling region 425, and a compensated coupled port 475 and a compensated isolated port 485 on equalizers 470, 480. Coupler 400 is symmetric such that the locations of the input and direct ports on the first transmission line could be exchanged with a similar exchange of the locations of the coupled and isolated ports on the second transmission line.

As shown in FIG. 4, equalizer 570 is realized as a first RC filter having a series connected resistor 572 and a capacitor 574 connected to ground; and equalizer 580 is realized as a second RC filter having a series connected resistor 582 and a capacitor 584 connected to ground. Numerous other circuits may be used in place of RC filters to realize the equalizer function. Such circuits may be made of discrete or distributed elements, of passive elements such as resistors, capacitors and inductors or of active elements such as transistors.

Figure 5:
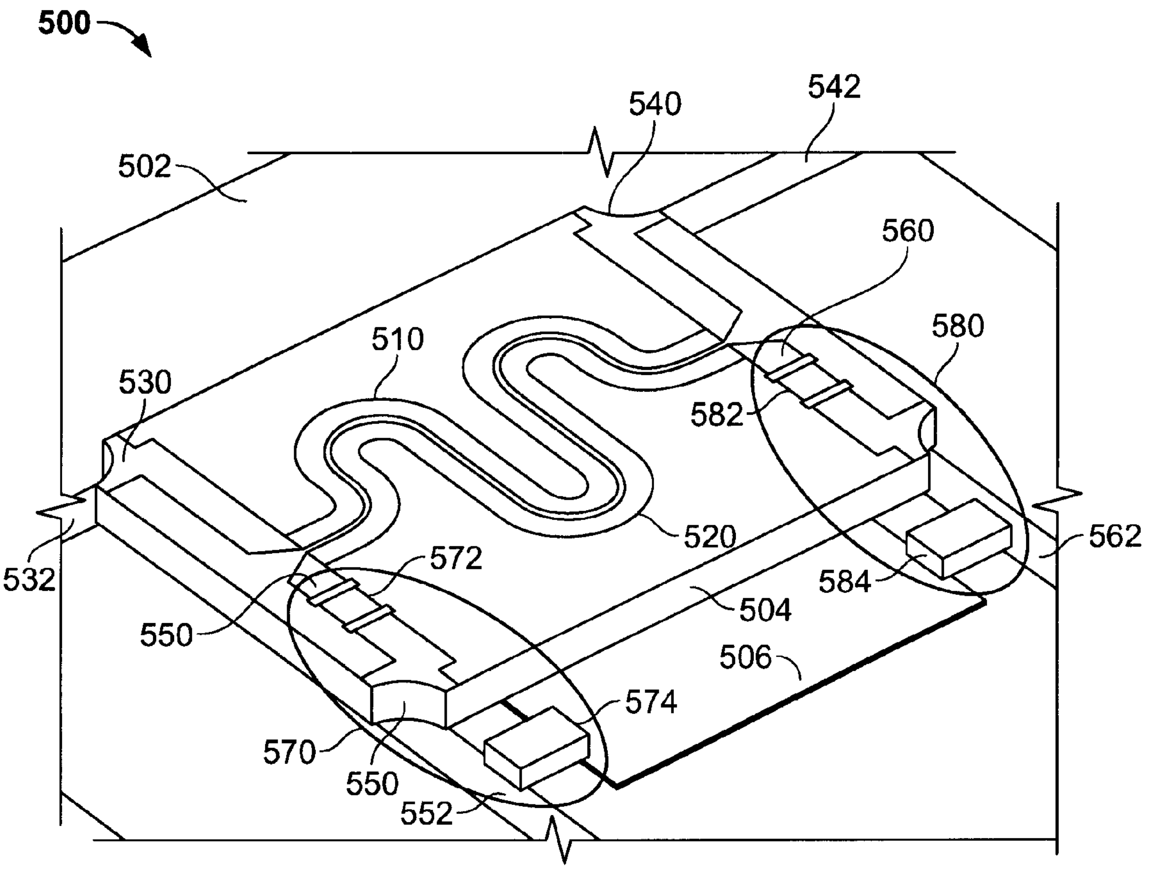
FIG. 5 is a perspective view of the embodiment of FIG. 3.

FIG. 5 is a perspective view of a directional coupler 500 of the present invention in which elements that correspond to elements of FIG. 3 bear the same number incremented by 200. Coupler 500 comprises first and second electromagnetically coupled signal transmission lines 510, 520 that are electromagnetically coupled in a coupling region 525 and first and second equalizers 570, 580 connected to the second transmission line on opposite sides of coupling region 525. Coupler 500 further comprises an input port 530 and a direct (or transmitted port) 540, connected to first transmission line 510 on opposite sides of coupling region 525 and a coupled port 550 and an isolated port 560 connected to second transmission line 520 on opposite sides of the coupling region 525. Coupler 500 is symmetric such that the locations of the input and direct ports on the first transmission line could be exchanged with a similar exchange of the locations of the coupled and isolated ports on the second transmission line.

FIG. 5 further comprises an insulating support surface 502, an insulating substrate 504, a ground plane 506 and leads 532, 542, 552, 562. Equalizer 570 comprises a resistor 572 and a capacitor 574; and equalizer 580 comprises a resistor 582 and a capacitor 584. Substrate 504 is typically a ceramic material such as alumina, aluminum nitride, beryllium oxide, CVD diamond, or quartz or any number of organic insulators. Typically, the substrate is approximately 0.5 and x 0.5 inch in size.

Transmission lines 510, 520 and resistors 572 and 582 are preferentially formed on the upper surface of substrate 504 by thick-film, thin-film or low temperature co-fired ceramic (LTCC)/high temperature co-fired ceramic (HTCC) technologies. Leads 532, 542, 552, 562 and ground plane 506 are printed on insulating surface 502. Capacitors 574, 584 are illustratively conventional multilayer ceramic chip capacitors having a multitude of metal layers separated by an insulating medium in which every other metal layer is connected to a first electrode at one end of the capacitor and the remaining metal layers are connected to a second electrode at the other end of the capacitor. One electrode of each of capacitors 574, 584 is connected to leads 552, 562, respectively, and the other electrode is connected to ground plane 506.

Figure 6:
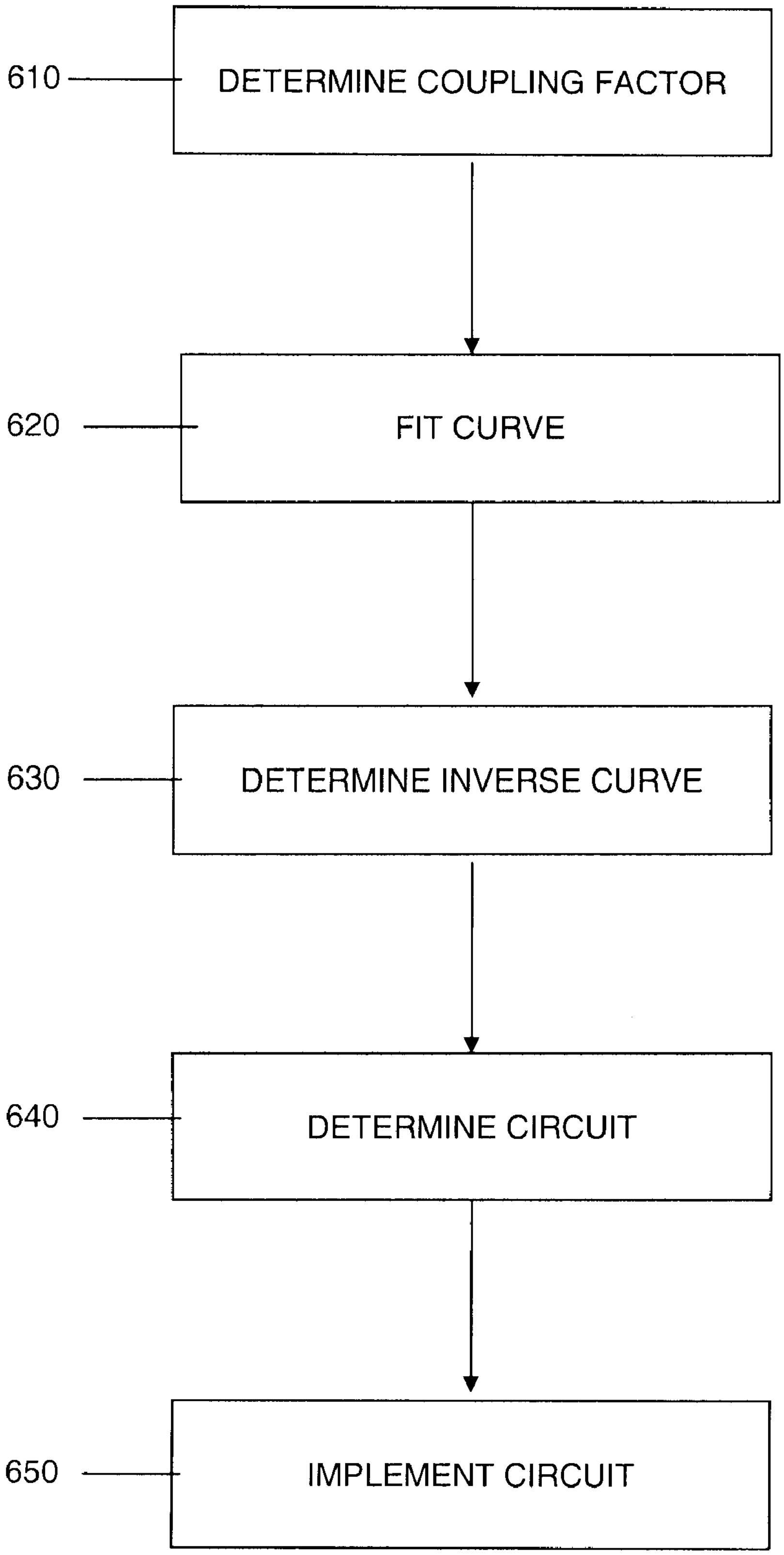
FIG. 6 is a flowchart depicting the design of a directional coupler in accordance with the invention.
Figure 7:
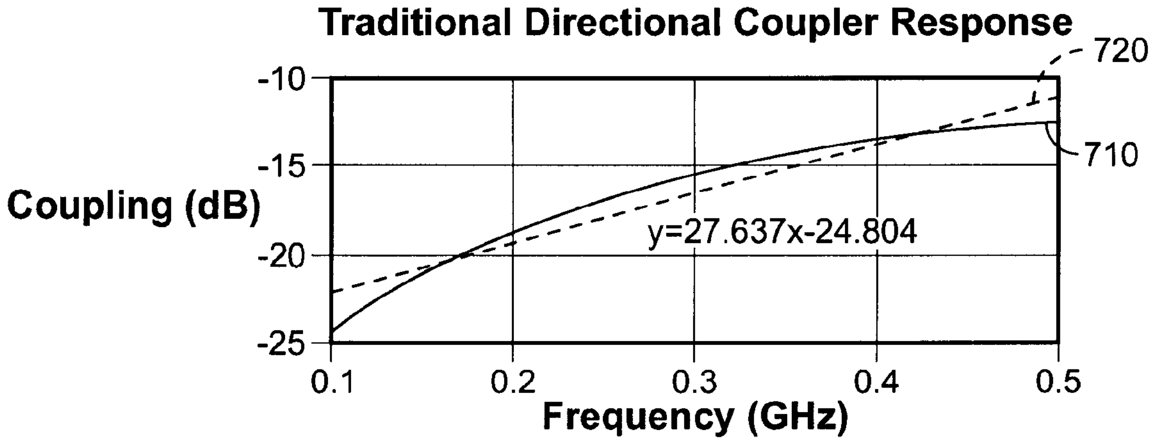
FIGS. 7, 8 and 9 are plots of signal coupling versus frequency useful in understanding the invention.

FIG. 6 is a flowchart depicting certain aspects of the design of the coupler of FIG. 3. At step 610, the variation of coupling factor with frequency is determined for the first and second coupled transmission lines over the desired operating frequency range of the coupler. The determination of variation may be made by measuring the coupling factor between the transmission lines over the operating frequency range of the coupler or by calculating the variation using an appropriate simulation of the electrical characteristics of the signal transmission lines. At step 620, a curve is fitted to the determined variation. The curve might be a linear approximation but any bounded curve that has a mathematical inverse can be used. FIG. 7 illustrates the case where the variation of coupling factor with frequency has been determined to be the curve 710 and a linear fit to the curve has been determined to be line 720 which is represented by the equation: $y=27.637x-24.804$.

At step 630, the inverse to the fitted curve is determined. In the case of line 720, this inverse is determined to be the line defined by the equation: $y=-27.64x$. This line is plotted as line 820 in FIG. 8.

At step 640, a circuit is determined that has a transmission characteristic that varies with frequency in accordance with line 820. One such circuit is an RC Filter. For the example of FIGS. 7 and 8, typical resistance values are approximately 30 Ohms and capacitance values are approximately 47 picoFarads.

At step 650, the circuit is implemented and combined with the first and second coupled transmission lines.

Figure 8:
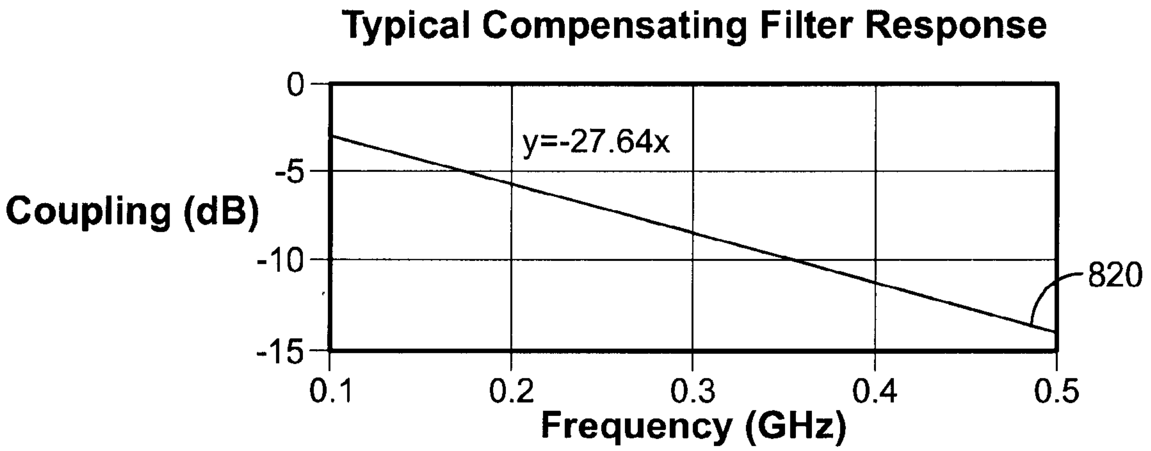
Figure 9:
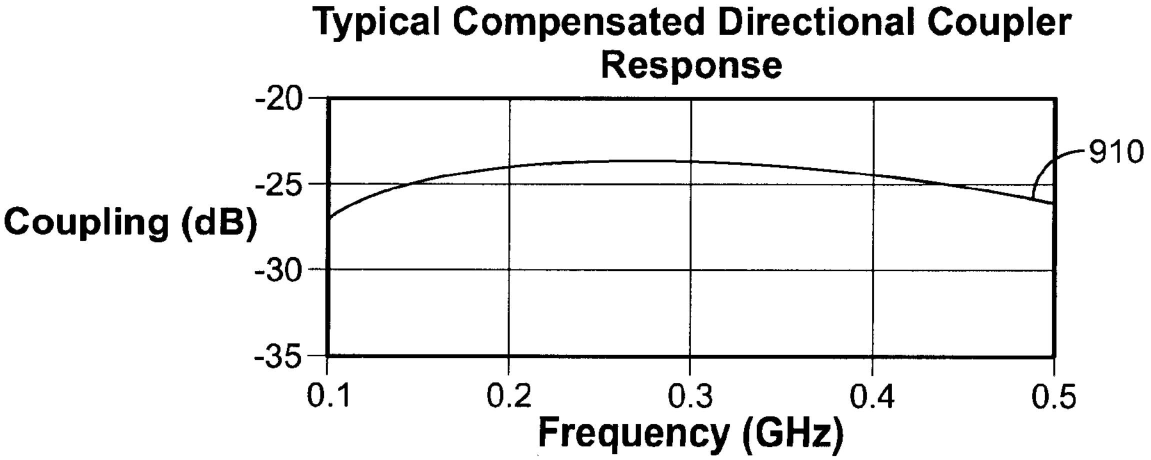

For the example of FIGS. 7 and 8, implementation of the circuit produces a directional coupler having a coupling factor that varies with frequency as shown by curve 910 of FIG. 9. As will be apparent, for this example, the coupling factor is approximately −27 dB at 100 MHz, approximately −26 dB at 500 MHz and does not vary by more than about 3 dB over the entire range of 100 MHz to 500 MHz.

Figure 10:
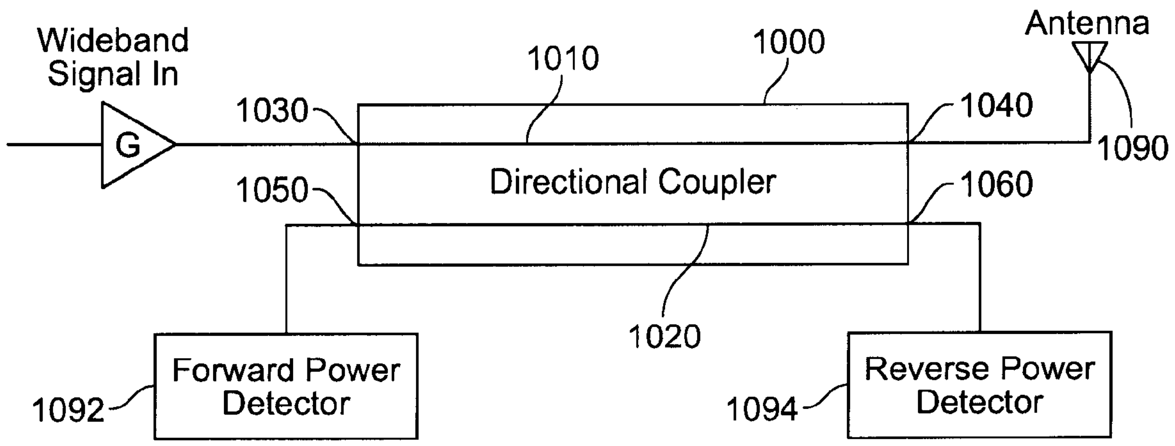
FIG. 10 is a block diagram illustrating a first application of the invention.

FIG. 10 is a block diagram illustrating the use of the directional coupler of the present invention for wideband power monitoring and fault detection in an antenna transmission system. A directional coupler 1000 such as that shown in FIGS. 3-5 comprises first and second transmission lines 1010, 1020, an input port 1030 and a direct port 1040 on the first transmission line and ports 1050 and 1060 on the second transmission line. In accordance with the invention, first and second equalizers (not shown in FIG. 10) are located between ports 1050 and 1060 and the portion of the second transmission line that is coupled to the first transmission line. Coupler 1000 is connected so as to receive a wideband signal at input port 1030 and provide the signal to antenna 1090 from a direct port 1040. A portion of the signal received by coupler 1000 is coupled to ports 1050 and 1060 where it can be detected by forward power detector 1092 and reverse power detector 1094.

Figure 11:
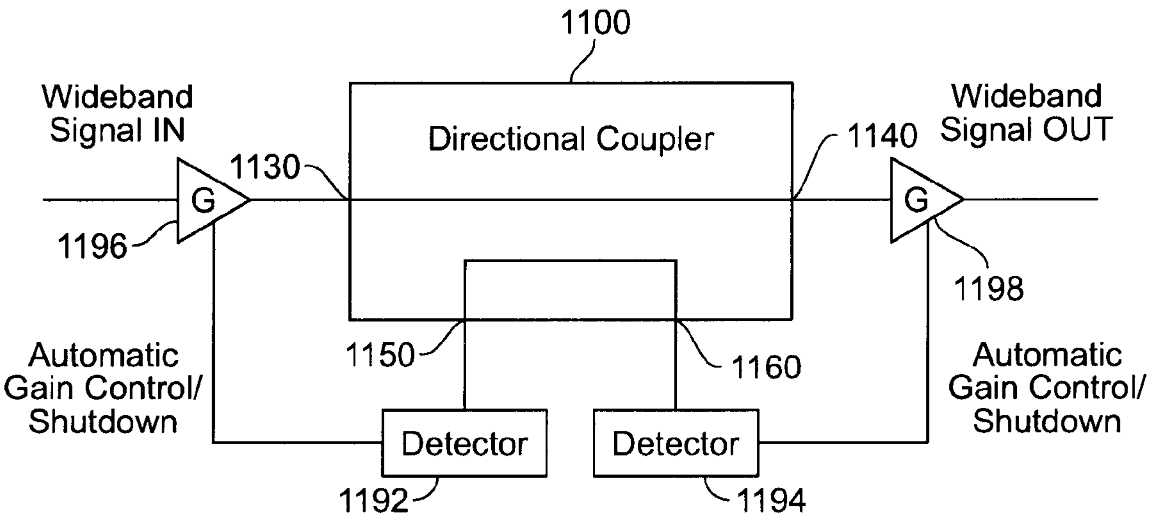
FIG. 11 is a block diagram illustrating a second application of the invention.

FIG. 11 is a block diagram illustrating the use of the directional coupler of the present invention as a wideband automatic gain control and shutdown mechanism for an amplifier chain. A directional coupler 1100 such as that shown in FIGS. 3-5 and 10 has the same elements as that of coupler 1000 and these are identified by the same numbers incremented by 100. Coupler 1100 receives a wideband signal at input port 1130 and provides a wideband signal out at direct port 1140. A portion of the signal received by coupler 1100 is coupled to ports 1150, 1160 where it can be detected by detectors 1192, 1194 and detectors 1192, 1194 can provide automatic gain control or shutdown to amplifiers 1196, 1198 in an input or output signal transmission path.

As will be apparent to those skilled in the art numerous variations may be made within the spirit and scope of the invention.

What is claimed is:

1. An electrical device comprising:

a directional coupler having coupled transmission lines, an output port, a direct port, a coupled port and an isolated port, a first equalizer coupled to the coupled port, and a second equalizer coupled to the isolated port wherein the first equalizer is an RC filter having a resistance of approximately 30 Ohms and a capacitance of approximately 47 picoFarads.

2. The electrical device of claim 1 wherein the first and second equalizers are both RC filters.

3. The electrical device of claim 2 wherein the resistance of each RC filter is approximately 30 Ohms and the capacitance is approximately 47 picoFarads.

4. The electrical device of claim 1 wherein the first equalizer has a transmission characteristic that substantially offsets the variation of coupling factor with frequency.

5. A directional coupler comprising:

first and second transmission lines in signal coupling relationship and first and second equalizers connected at opposite ends of the second transmission line wherein the first equalizer is an RC filter having a resistance of approximately 30 Ohms and a capacitance of approximately 47 picoFarads.

6. The electrical device of claim 5 wherein the first and second equalizers are both RC filters.

7. The electrical device of claim 6 wherein the resistance of each RC filter is approximately 30 Ohms and the capacitance is approximately 47 picoFarads.

* * * * *